United States Patent [19]

Tsang

[11] 4,213,806
[45] Jul. 22, 1980

[54] FORMING AN IC CHIP WITH BURIED ZENER DIODE

[75] Inventor: Wei K. Tsang, Bedford, Mass.

[73] Assignee: Analog Devices, Incorporated, Norwood, Mass.

[21] Appl. No.: 948,673

[22] Filed: Oct. 5, 1978

Related U.S. Application Data

[62] Division of Ser. No. 801,410, May 27, 1977, Pat. No. 4,136,349.

[51] Int. Cl.² .............................................. H01L 7/44
[52] U.S. Cl. .................................. 148/187; 148/189; 357/13; 357/89; 357/90
[58] Field of Search ................... 148/187; 357/13, 89, 357/90

[56] References Cited

U.S. PATENT DOCUMENTS

| | | | |
|---|---|---|---|
| 3,378,915 | 4/1968 | Zenner | 148/187 X |
| 3,765,961 | 10/1973 | Mar | 148/187 X |
| 3,881,179 | 4/1975 | Howard | 357/13 |
| 3,886,001 | 5/1975 | Dobkin | 148/187 X |
| 4,099,998 | 7/1978 | Ferro et al. | 148/187 |
| 4,136,349 | 1/1979 | Tsang | 357/13 |

*Primary Examiner*—G. Ozaki
*Attorney, Agent, or Firm*—Parmelee, Johnson, Bollinger & Bramblett

[57] ABSTRACT

An IC chip having a Zener diode with a subsurface breakdown junction to assure stable operation. The diode is formed by a triple diffusion process compatible with conventional bipolar processing. A deep p++ diffusion first is applied, reaching through the epitaxial region to the buried n+ layer; next, a shallow p+ diffusion is formed over the deep p++ diffusion and extending laterally beyond that diffusion; finally, a shallow n+ diffusion is applied over the p diffusions, to form a subsurface breakdown junction therewith. The topology of the mask windows is selected to provide concentration profiles which insure that the breakdown occurs at the subsurface junction, and that other desirable diode characteristics are achieved.

6 Claims, 3 Drawing Figures

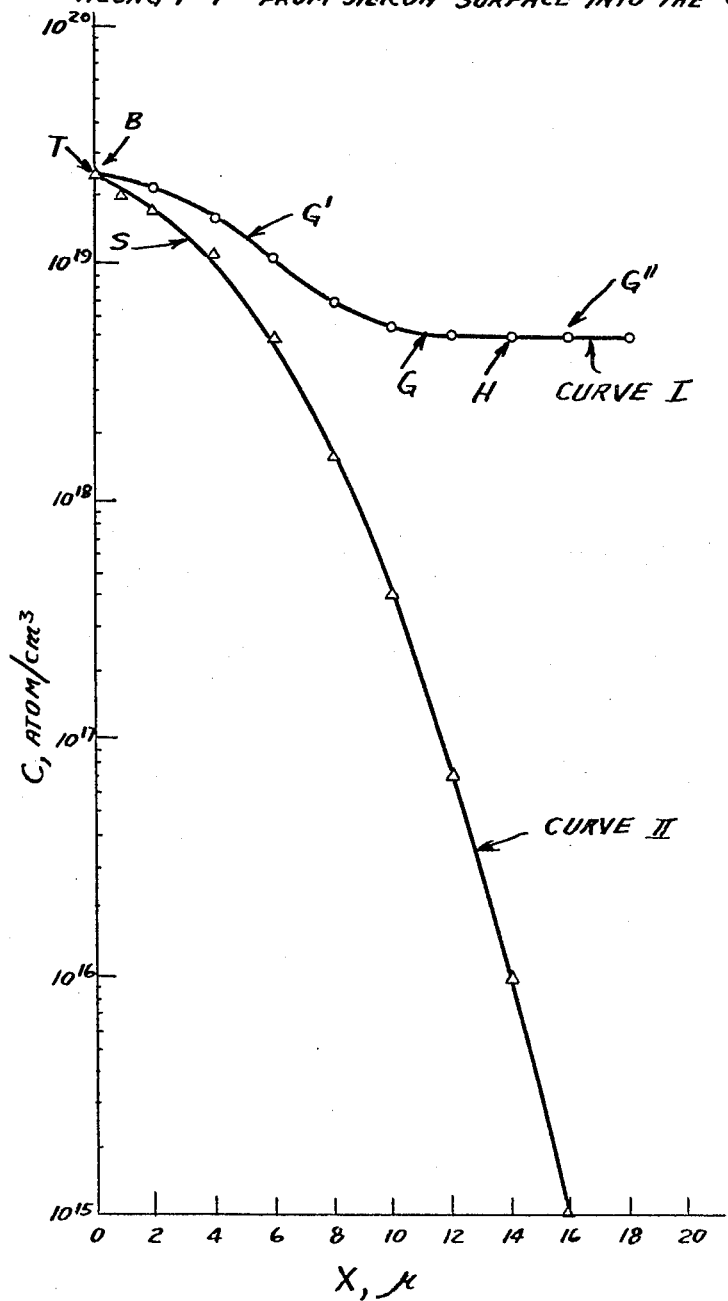

FORMING AN IC CHIP WITH BURIED ZENER DIODE

This is a division, of application Ser. No. 801,410 filed May 27, 1977 now U.S. Pat. No. 4,136,349.

BACKGROUND OF THE INVENTION

1. Field of the Invention

This invention relates to integrated circuit (IC) chips of the type having diffused therein a Zener diode junction to provide a reference voltage. More particularly, this invention relates to such a Zener diode formed with a special diffusion pattern to provide significantly improved characteristics, especially enhanced stability in operation.

2. Description of the Prior Art

IC devices have for some time now included Zener diode junctions to provide a reference voltage for the associated circuitry on the chip. Typically in such arrangements the breakdown occurs at the $p^+n^+$ junction at the silicon/silicon dioxide interface of the chip. There have, however, been problems with such devices, especially drift of the breakdown voltage, e.g. as a function of time and with changes in temperature.

It has been suggested that the cause of such instability is related to the presence of the passivating/insulating layer of silicon dioxide which lies adjacent the silicon surface where breakdown takes place. It reportedly has been proposed to employ a device with subsurface breakdown based on the use of ion implantation, which theoretically could avoid problems encountered with the typical surface breakdown diodes. However, the ion implantation approach is not truly satisfactory, especially because the required manufacturing process becomes relatively complicated. Accordingly, there has been a need to provide an improved IC Zener diode whereby superior stability and other desirable characteristics can be achieved with a relatively simple manufacturing process.

SUMMARY OF THE INVENTION

In a preferred embodiment of the present invention, to be described hereinbelow in detail, an IC chip is formed with a subsurface breakdown Zener diode, i.e. a so-called "Buried Zener". This diode is formed in a procedure which is fully compatible with conventional bipolar IC processes, so that no additional processing complications are introduced. The diode-forming procedure basically comprises three sequential diffusions, which are controlled so as to provide dopant concentrations having predetermined relationships. The result is an IC Zener diode having superior characteristics, especially with respect to stability but also including relatively low series resistance, and an appropriate value of breakdown voltage.

BRIEF DESCRIPTION OF THE DRAWINGS

FIG. 3 is a graph on log scale showing the variation in concentration of p dopant within the chip (1) along a horizontal line in the plane corresponding to line 2—2 of FIG. 1, at the silicon/silicon-dioxide interface, and (2) along a vertical line through the center of the diode structure.

DESCRIPTION OF A PREFERRED EMBODIMENT

Figure 1:
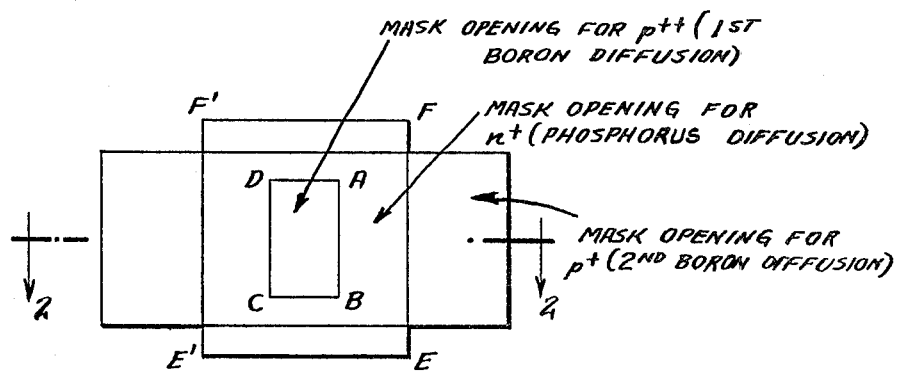
FIG. 1 shows in plan outline the configuration of the three mask windows used to control the diffusion pattern for a diode in accordance with this invention.

In the preferred embodiment of this invention, diffusions are carried out on a conventional wafer comprising a silicon substrate 10 (FIG. 2) of p-type material having an epitaxial layer 12 of n-doped silicon and the usual $n^+$ buried layer 14 at the horizontal interface. The first step is to make a deep diffusion of p-type dopant (in this case boron) into the epitaxial layer to form a highly concentrated $p^{++}$ region 16 which extends down to the $n^+$ buried layer 14. This diffusion is applied through a relatively small mask window, labelled ABCD in FIG. 1. The diffused region extends laterally a substantial distance away from the edges of the window, due to the depth of the diffusion.

This first diode diffusion step is carried out simultaneously with the isolation diffusion step for the IC chip, wherein deep isolation bands are formed between the transistors of the associated circuitry to be placed on the chip. Thus no additional processing is required for this first diode diffusion step.

Figure 2:
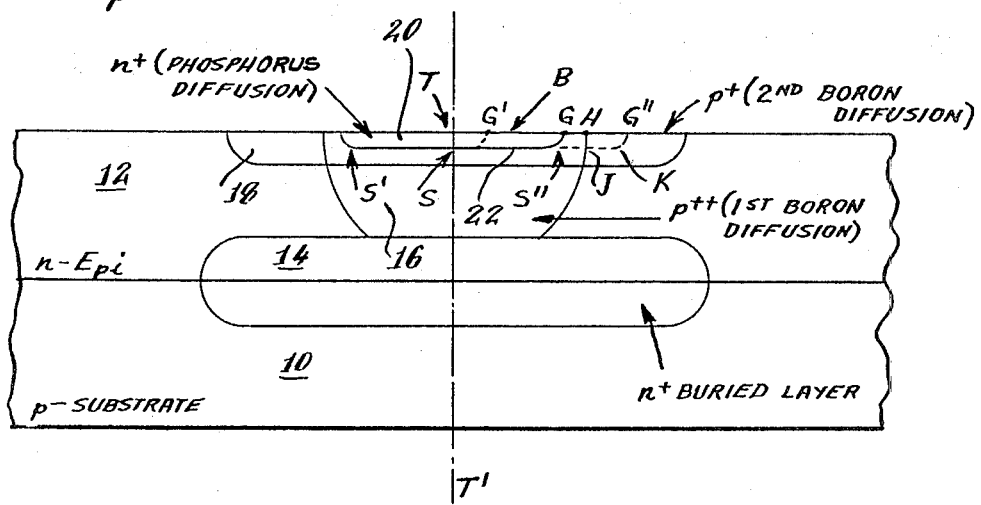
FIG. 2 is a cross-section view of the IC chip, taken along the vertical plane corresponding to line 2—2 of FIG. 1.

The next step is to make a relatively short-duration diffusion of p-type material (boron) to form a comparatively shallow $p^+$ region 18, over the deep $p^{++}$ region 16 but laterally wider, as seen in the vertical section plane of FIG. 2. The window for this diffusion is relatively elongate in the horizontal direction (referring to FIG. 1) to provide for lateral extension substantially beyond the side edge of the preceding deep diffusion 16. This diffusion is carried out simultaneously with the diffusion for the transistor base regions of the associated circuitry on the chip, and thus does not require any additional processing.

Finally, n-type dopant (e.g. phosphorus) is diffused centrally over the preceding two diffusions, to form a shallow $n^+$ region 20 located wholly within the side edges of the first deep $p^{++}$ diffusion 16, in the vertical plane of FIG. 2, and having less depth than the second diffused region 18. The mask window for this third diffusion has a nearly square configuration EFF'E', whereas the window for the second diffusion is an elongate rectangle. The third diffusion is carried out simultaneously with the diffusion for forming the emitters of the transistors of the associated circuitry on the chip, and thus requires no additional processing.

The breakdown junction of the diode formed as described above is the horizontal interface 22 between the $n^+$ region 20 and the $p^+$, $p^{++}$ regions 16, 18. Electrical connection to the n terminal of this junction is effected through a contact (not shown) formed on the surface of the $n^+$ region 20. Electrical connection to the p terminal of the junction is effected through a contact (not shown) formed on the surface of the $p^+$ region 18, where it extends out laterally beyond the $n^+$ region 20. Thus, the electrical connection for the p terminal of the diode passes through the laterally extended portion of the $p^+$ region 18 which reaches to the silicon surface, and through the subsurface $p^+$ channel JK which lies between the $n^+$ region 20 and the epitaxial layer 12.

It will be seen from FIG. 2 that the side edges of the shallow $p^+$ diffusion lie beyond the corresponding side edges of the deep $p^{++}$ diffusion 16, in the vertical plane of the cross-sectional view. The side edges of the deep $p^{++}$ diffusion are, in turn, beyond the side edges of the $n^+$ diffusion 20, in that vertical plane. (In the vertical plane at right angles to the cross-section view, the n+ diffusion extends beyond the p diffusions so that there is not a pn surface junction in that plane.)

To provide the best results the concentration profile of p dopant in the diode should be controlled to provide certain interrelationships. In particular, the concentration of p dopant (boron) in the central region S forming the horizontal junction 22, i.e. the region lying within the confines of S' S'', is controlled to be larger than the concentration of boron in the surface region G between the inner n+ region 20 and the p++, p+ regions 16, 18 adjacent the n+ region. This relationship is illustrated in the graph of FIG. 3, where the concentration of boron at G is shown at a corresponding location on curve I and the concentration of boron at S is shown at a corresponding location on curve II.

This desired relationship can be achieved by preselecting the dimensions and locations of the mask windows for the diffusions, especially by fixing the location EFF'E' in relation to that of ABCD. Placement of the side edges of EFF'E' at positions other than optimum will result in deterioration of the desired diode characteristics. For example, if the edge EF is too far to the left, so that the n+ diffusion intercepts the boron at a point where the boron concentration in higher than at S (as illustrated in interrupted outline by the position of a hypothetical resulting diffusion side edge G'), the device will behave more as a surface breakdown diode, with its attendant deficiencies as discussed above. Alternatively, if the edge EF is too far to the right, so that the n+ diffusion intercepts the boron region where the p dopant concentration is essentially the surface concentration of the shallow p+ diffusion (a position illustrated in interrupted outline by hypothetical diffusion side edge G''), the electrical connection channel JK to the subsurface junction 22 will be relatively long and will introduce too great a resistance in series with the diode.

By utilizing the optimum relationships described above, it becomes possible to provide a very stable IC Zener diode having a series resistance less than about 300 ohms, a desirable breakdown voltage of about 6–7 volts, and an advantageous voltage temperature coefficient of about 2.5 mV/°C.

Although a specific preferred embodiment of the invention has been described herein in detail, it is desired to emphasize that this is for the purpose of illustrating the principles of the invention, and should not necessarily be construed as limiting of the invention since it is apparent that those skilled in this art can make many modified arrangements of the invention without departing from the true scope thereof.

I claim:

1. The method of making an IC chip with a buried Zener diode layer comprising the steps of:

diffusing p dopant into said chip through a first window having a predetermined lateral dimension in one direction to produce a first deep p layer having a second predetermined lateral surface dimension in said direction which is substantially larger than said first dimension;

diffusing p dopant into said chip to form a second p layer which is shallower than said first layer but which overlies said first layer and has side regions extending beyond said first layer in said one direction;

diffusing n dopant into said chip to form an n layer which is shallower than said second p layer and which is located within the surface boundaries of said first deep p layer, in said one direction; and controlling the diffusion of said n layer to provide a lateral dimension in a second direction perpendicular to said one direction sufficient that the concentration of p dopant at the surface boundary of the n layer in said second direction is less than the concentration of p dopant at the buried horizontal interface between said n layer and the p dopant diffused in the first two diffusion steps.

2. The method of claim 1, wherein said n dopant is diffused into said chip through a window having a larger lateral dimension than said first window, in said one direction.

3. The method of claim 1, wherein said first and second layers are diffused to provide a higher concentration of p dopant in the regions thereof which are centrally beneath said n layer than in the surface regions thereof immediately adjacent said n layer.

4. The method of claim 1, wherein said chip comprises a p substrate with an epitaxial n layer and an n+ buried layer in the interface region between the substrate and the epitaxial layer;

said deep p layer being diffused down through said epitaxial layer sufficiently to reach said n+ buried layer.

5. The method of claim 4, wherein said first p layer is produced by a p++ boron diffusion, said second p layer is produced by a p+ boron diffusion, and said first n layer is produced by an n+ phosphorus diffusion.

6. In a process for forming IC circuitry on a silicon chip wherein the process comprises the steps of (a) a relatively deep p diffusion to form isolation barriers between separate sections of the IC circuitry, (b) a relatively shallow p diffusion for establishing the base regions of the transistors of the chip circuitry, and (c) a shallow n diffusion to form the emitter regions of said transistors, the method of making a buried Zener diode during said process comprising the steps of:

(1) diffusing a deep p region for said diode during step (a) above;

(2) diffusing a relatively shallow p region for said diode directly over said deep p diode region during step (b) above;

(3) diffusing a shallow n region directly over said shallow p diode region, to form a buried junction with the p regions therebeneath established by steps (1) and (2) hereof; and (4) controlling the concentrations of dopant during said diode diffusion steps, by utilizing predetermined mask windows, such that the concentration of p dopant at said buried pn junction is greater than the p dopant concentration at the surface boundaries of said shallow n diffusion, to provide for breakdown limited to said buried junction.

* * * * *